(12) United States Patent
Fulford et al.

(10) Patent No.: US 6,258,681 B1
(45) Date of Patent: Jul. 10, 2001

(54) USE OF A RAPID THERMAL ANNEAL PROCESS TO CONTROL DRIVE CURRENT

(75) Inventors: H. Jim Fulford; Thomas Sonderman, both of Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/426,304

(22) Filed: Oct. 25, 1999

(51) Int. Cl.[7] .................................................. H01L 21/336
(52) U.S. Cl. ....................... 438/305; 438/275; 438/303; 438/307; 438/530; 438/542
(58) Field of Search .................................. 438/199, 275, 438/299, 542, 530, 303, 305, 307

(56) References Cited

U.S. PATENT DOCUMENTS 5,960,283 * 9/1999 Sato ...................................... 438/257
6,051,483 * 4/2000 Lee et al. ............................. 438/560

* cited by examiner

*Primary Examiner*—Long Pham
(74) *Attorney, Agent, or Firm*—Williams, Morgan & Amerson, P.C.

(57) ABSTRACT

The present invention is directed to a control method for maintaining the drive current of a transistor within acceptable limits. The method comprises determining a size variation of a component of a transistor, e.g., the width of a gate conductor, the width of sidewall spacers or the thickness of the gate dielectric, determining the parameters of an anneal process based upon the determined size variation of the component and performing the anneal process using the determined parameters.

39 Claims, 9 Drawing Sheets

USE OF A RAPID THERMAL ANNEAL PROCESS TO CONTROL DRIVE CURRENT

BACKGROUND OF THE INVENTION

1. Field of the Invention

The present invention is generally directed to the field of semiconductor processing, and, more particularly, to using a rapid thermal anneal process to control the drive current of a transistor.

2. Description of the Related Art

By way of background, FIG. 1 depicts an illustrative NMOS field effect transistor 10 formed above a surface 14 of a semiconducting substrate 12 between trench isolation regions 25. The transistor 10 is comprised of a gate dielectric 16, a gate conductor 18, a plurality of sidewall spacers 20 and source/drain regions 28.

In the design of modem transistors, a parameter known as drive current ($I_D$) is a significant parameter. In general, the drive current is the amount of current flowing through a transistor when it is turned "ON", i.e., when the proper voltage is applied to the gate conductor 18 of the transistor 10. However, the drive current of a transistor is affected by the physical dimensions of a transistor or some of its components, e.g., the nominal channel length "L", which is roughly equivalent to the width of the gate conductor 18, the width of the sidewall spacers 20, and the thickness of the gate dielectric 16, etc. For example, all the other things being equal, the larger the channel length, the slower the transistor will operate. Similarly, the thicker the gate dielectric, the slower the transistor will operate.

During the course of manufacturing a transistor, the size of the various components of the transistor, as actually built, may vary from the anticipated or design size of the components. As a result, transistor performance, as well as integrated circuit devices incorporating such transistors, may be adversely impacted. For example, assume that a gate conductor 18 is formed to a width greater that its design width, this will result in the channel length of the transistor being greater that anticipated. As a result, the transistor will operate at a slower speed. When this occurs to many of the thousands of transistors formed on an integrated circuit device, the overall operating speed and efficiency of the integrated circuit device may also suffer. What is desired is to have a method for manufacturing transistors, and integrated circuit devices incorporating the same, that helps to maintain device performance within acceptable limits. In particular, it is desirable to have a method of compensating for variations in the manufacturing process that may adversely impact the drive current of the transistor.

The present invention is directed to a method of making a semiconductor device that minimizes or reduces some or all of the aforementioned problems.

SUMMARY OF THE INVENTION

The present invention is directed to the use of an anneal process to improve or control the performance of a semiconductor device, e.g., a transistor, as well as integrated circuit products incorporating such devices. In on illustrative embodiment, the method initially comprises determining a size variation of a component of a transistor, e.g., the width of the gate conductor, the width of a sidewall spacer or the thickness of the gate dielectric, etc., as compared to the design size of that component. Thereafter, the method comprises determining at least one parameter of an anneal process to be performed on the transistor based upon the determined size variation of the component, and performing the determined anneal process. In another illustrative embodiment, the method comprises determining a physical dimension of a gate conductor, a sidewall spacer or a gate dielectric of a transistor, determining at least one parameter of an anneal process to be performed on the transistor based upon the determined physical dimension, and performing the determined anneal process.

BRIEF DESCRIPTION OF THE DRAWINGS

The invention may be understood by reference to the following description taken in conjunction with the accompanying drawings, in which like reference numerals identify like elements, and in which.

Figure 1:
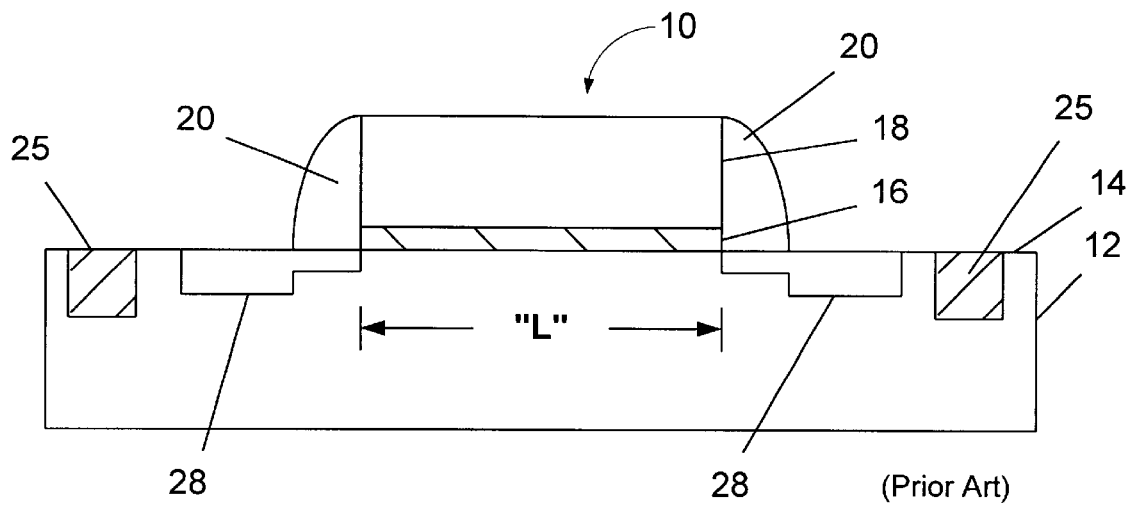
FIG. 1 is a cross-sectional view of an illustrative prior art field effect transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Although the various regions and structures of a semiconductor device are depicted in the attached drawings as having very precise, sharp configurations and profiles, those skilled in the art recognize that, in reality, these regions and structures are not as precise as indicated in the drawings.

Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to use of a rapid thermal anneal process to control the drive current of a transistor. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

Figure 2A:
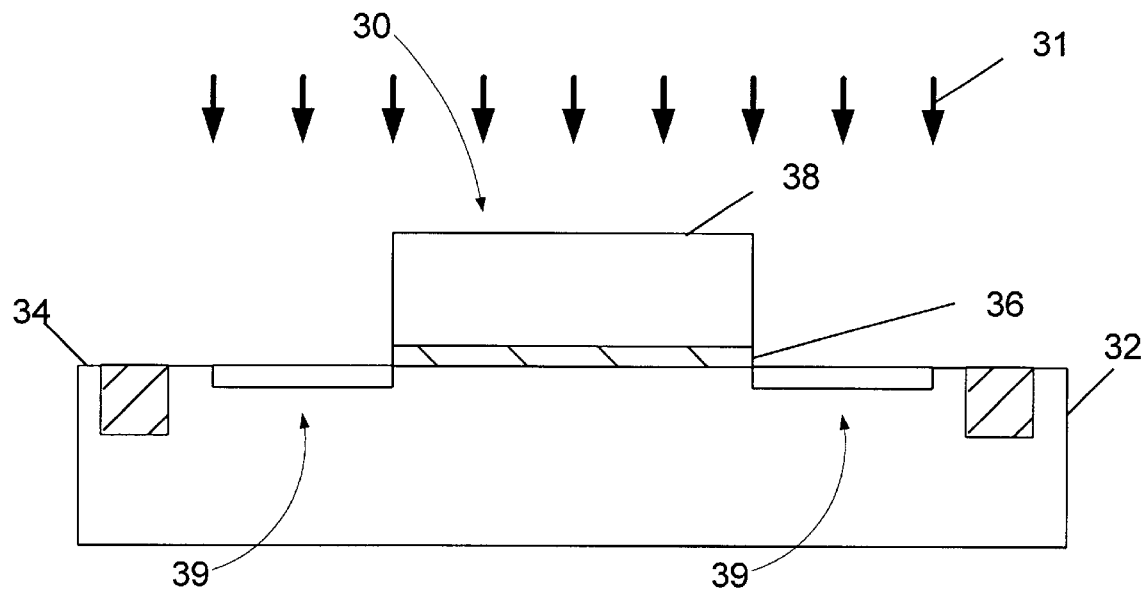
FIGS. 2A–2D are cross-sectional views of a partially formed field effect transistor.

A very brief review of one illustrative process flow for making an illustrative NMOS transistor 30 will now be described with reference to FIGS. 2A–2D. As shown in FIG. 2A, an illustrative, partially formed NMOS field effect transistor 30 is formed above a surface 34 of a semiconducting substrate 32. Although the transistor 30 depicted in FIG. 2 is an NMOS transistor, the present invention is not limited to any particular technology. At this stage of fabrication, the transistor 30 is comprised of a gate dielectric 36, a gate conductor 38, and dopant implant regions 39 that have been subjected to a light-doping ion implantation process, as indicated by arrows 31, with the appropriate dopant atoms, e.g., arsenic for NMOS technology. The regions 39 of the transistor 30 may be formed by subjecting the transistor 30 to an ion implantation process wherein the dopant concentration ranges from approximately $8 \times 10^{13} \times 9 \times 10^{14}$ ions/cm$^2$ of the appropriate dopant material and the energy level ranges from 2–20 keV.

The particular materials and techniques used to form the various components of the transistor, e.g., the gate dielectric 36 and the gate conductor 38, are matters of design choice, and, thus, should not be considered a limitation of the present invention. For example, the gate dielectric 36 may be comprised of silicon dioxide, and it may be formed by a thermal growth process or by a deposition process. Similarly, the gate conductor 38 may be comprised of polysilicon, and it may be formed by depositing a layer of polysilicon, and thereafter, patterning the layer of polysilicon using known photolithographic and etching processes to define the gate conductor 38.

Figure 2B:
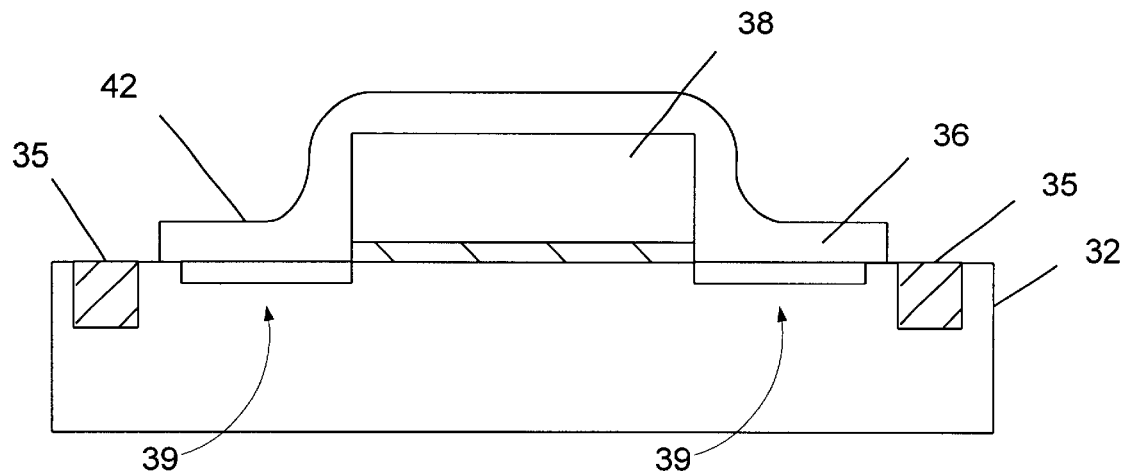
Figure 2C:
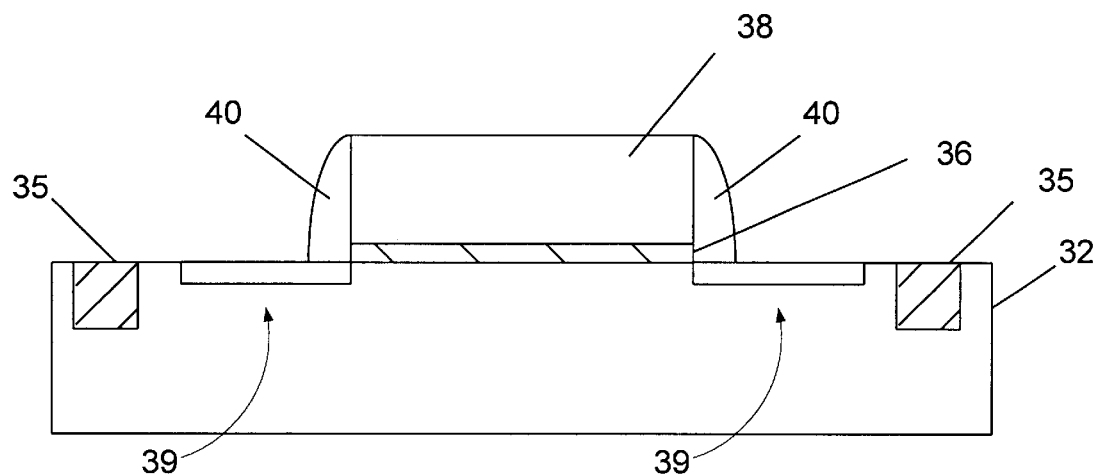

Next, as shown in FIGS. 2B and 2C, a plurality of sidewall spacers 40 (see FIG. 2C) are formed adjacent the gate conductor 38. The sidewall spacers 40 are formed by blanket-depositing a layer of spacer material 42 (see FIG. 2B) over the transistor 30, and thereafter performing an anisotropic etching process. As will be apparent to those skilled in the art upon a complete reading of the present application, the sidewall spacers 40 may be formed from any of a variety of materials, such as silicon dioxide, silicon nitride, etc. Moreover, multiple sidewall spacers may be formed adjacent one side of the gate conductor 38.

Figure 2D:
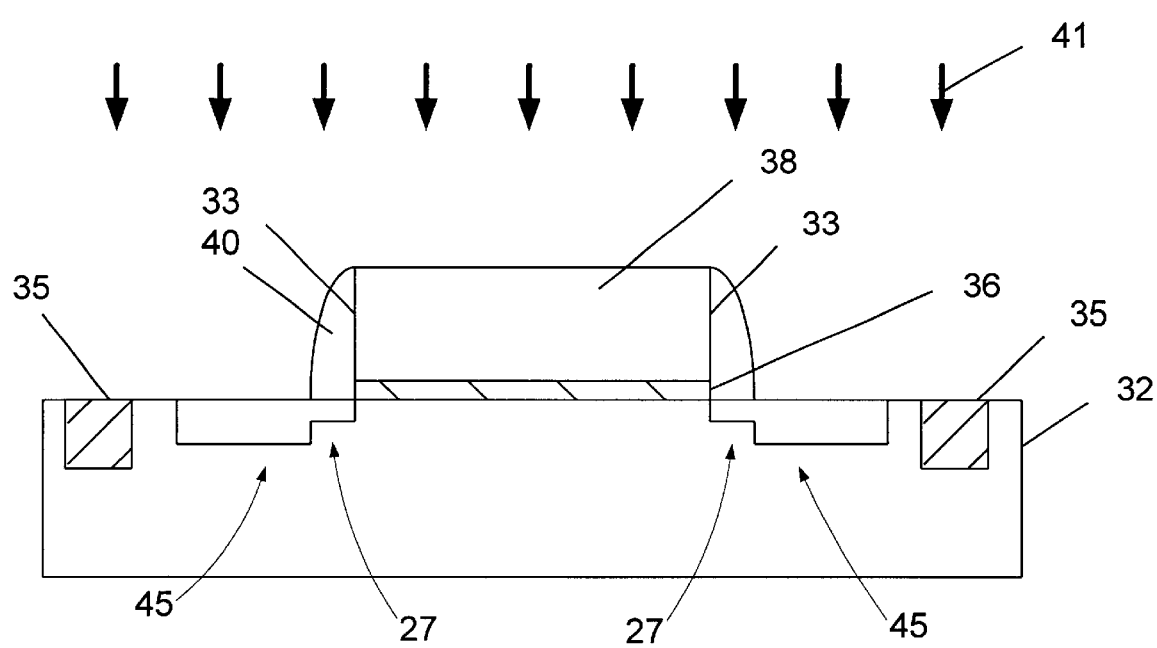

Next, as shown in FIG. 2D, the transistor 30 is subjected to another ion implantation process, as indicated by arrows 41, to form source/drain regions 45 having the familiar lightly doped drain ("LDD") structure. During this process, the sidewall spacers 40 essentially act as a mask to prevent some of the dopant atoms in the second implantation process from penetrating the region 27 under the spacers 40. Of course, the formation of source/drain regions 45 having this LDD structure is not required to practice the present invention. The concentration of dopant atoms during this second implantation process may range from $49 \times 10^{15}$ ions/cm$^2$ and the implantation energy level may be varied from 2–15 keV. The appropriate dopant atoms are selected for the appropriate technology involved, e.g., arsenic for NMOS technology, boron for PMOS technology.

After the second implantation step is performed, an annealing step is typically performed to activate the dopant atoms implanted into the substrate 32 and to repair any damage to the lattice structure of the substrate as a result of the implantation processes. This step may be a rapid thermal anneal ("RTA") process at, for example, a temperature ranging from approximately 950–1100° C., and for a time duration ranging from approximately 5–30 seconds. During this annealing step, the dopant atoms diffuse in essentially all directions. That is, the dopant atoms are driven deeper into the substrate 32 and they also diffuse in a lateral direction, i.e., some of the dopant atoms extend slightly under sides 33 of the gate conductor 38, although that situation in not depicted in FIG. 2D.

Figure 3A:
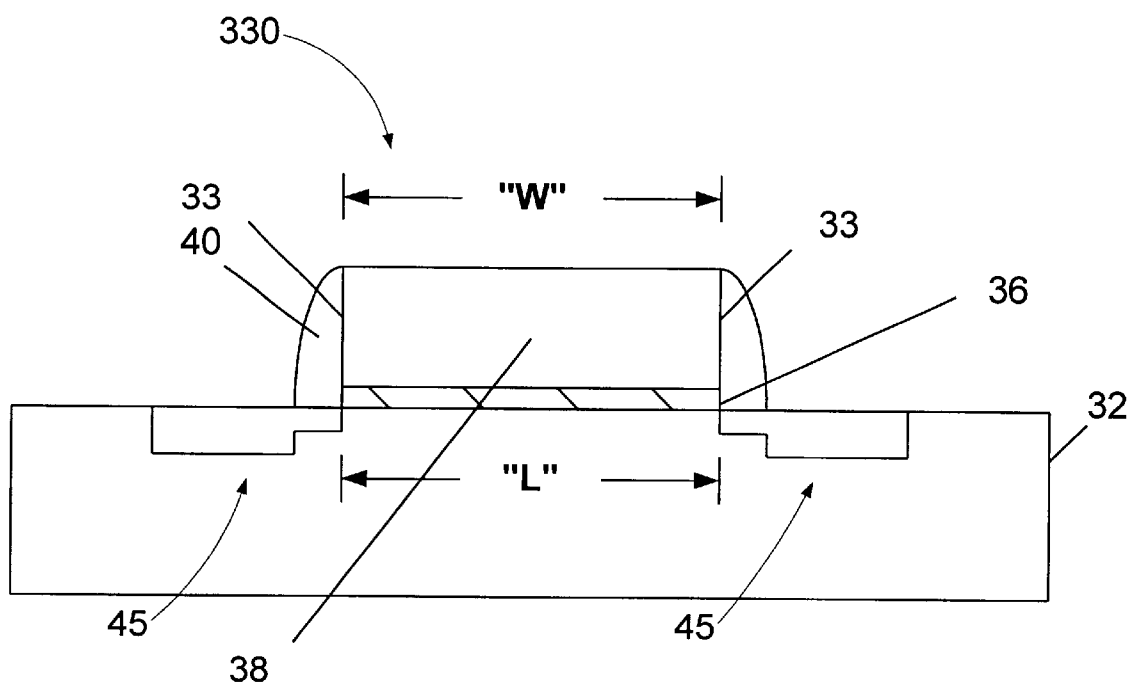
FIGS. 3A–3B are cross-sectional views of a partially formed transistor depicting one illustrative situation where the present invention may be employed; spacer material has been added.
Figure 3B:
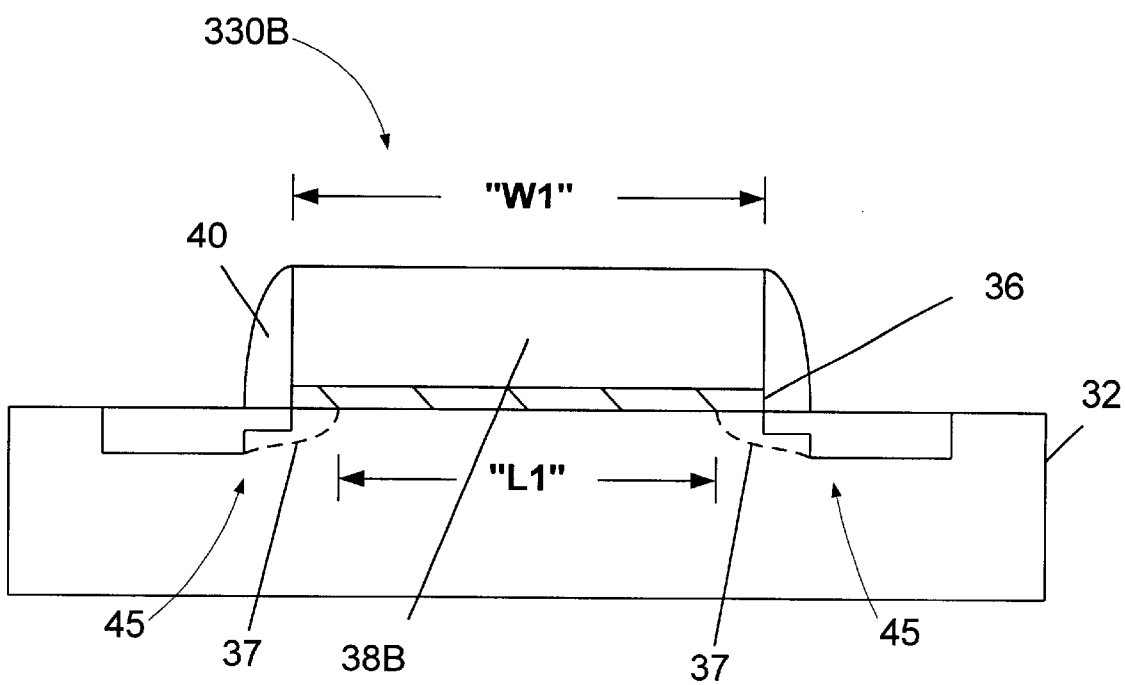

FIGS. 3A–3B depict one illustrative situation in which the present invention may be used. The various components of an illustrative transistor 330 depicted in FIG. 3A are in accordance with the design dimensions of the components. That is, for the transistor 330 depicted in FIG. 3A, the gate conductor 38 has a width "W" that corresponds to the design width for the gate conductor 38, as determined by the design process. The transistor 330 also has a channel-length "L" that is approximately the same as the width "W" of the gate conductor 38. In contrast, the transistor 330B depicted in FIG. 3B has a gate conductor 38B that has a width "W1" that is greater than the design width of the transistor, i.e., W1 is greater than W shown in FIG. 3A. One result of the oversized gate conductor 38B is that the source/drain regions 45 in FIG. 3B are spaced apart a greater distance than the source/drain regions 45 shown in FIG. 3A. The net result is that the channel-length of the transistor 330B is greater than the channel-length of the transistor 330 shown in FIG. 3A.

To compensate for this situation, an anneal process, e.g., a rapid thermal anneal process, may be performed. For example, by varying the duration and/or temperature of the anneal process, the anneal process can be used to compensate for the oversized gate conductor 38B shown in FIG. 3B. That is, the duration and/or temperature of the anneal process may be increased, as compared to the process that would be performed on the transistor depicted in FIG. 3A, to cause the dopant atoms in the source/drain regions 45 shown in FIG. 3B to diffuse a greater distance than they would diffuse if the standard anneal process were performed on the source/drain regions 45. In effect, by varying one or more parameters of the anneal process, the dopant atoms in the source/drain regions in FIG. 3B can be driven so as to produce a channel-length L1 that is approximately equivalent to the design channel length L of the transistor 330 as shown in FIG. 3A. That is, the dopant atoms may be driven to the area defined by the dashed lines 37 shown in FIG. 3B.

Figure 4A:
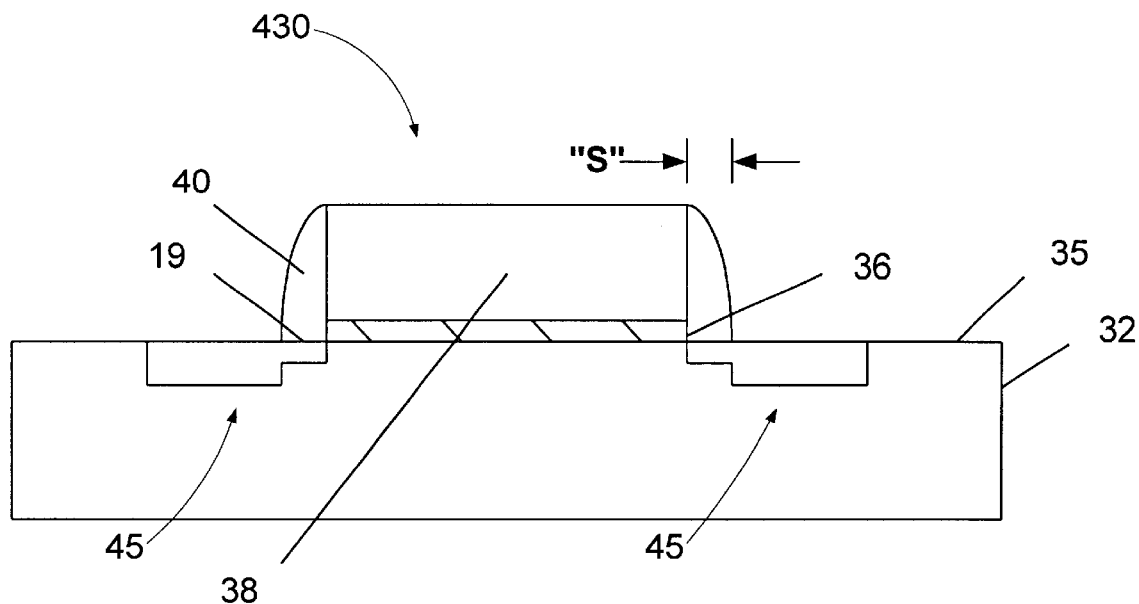
FIGS. 4A–4B are cross-sectional views of a partially formed transistor depicting another illustrative situation where the present invention may be employed.
Figure 4B:
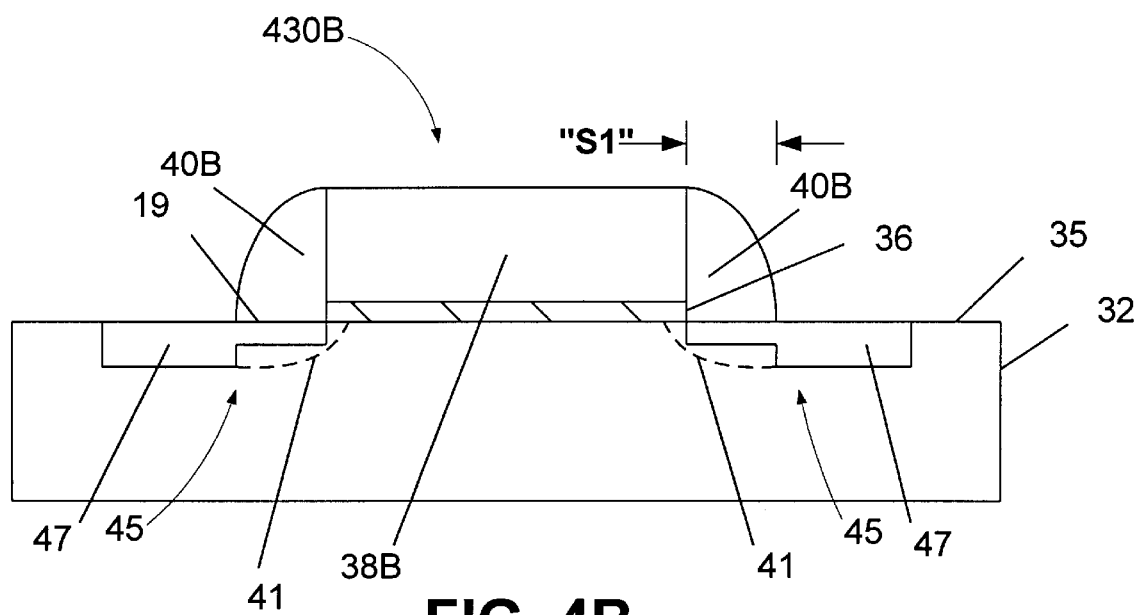

Another illustrative situation in which of the present invention may be used is shown in FIGS. 4A and 4B. As shown therein, a transistor 430 is comprised of various components that are manufactured to their design size. The sidewall spacers 40 on the transistor 430 shown in FIG. 4A have a width "S. The reference point of the sidewall spacers 40 for determining this dimension "S" is a matter of design choice. However, the width "S" is generally understood to be the width of the spacer at the point where the base 49 of spacer 40, or an extension thereof, contacts the underlying structure, e.g., surface 19 of the substrate 32.

FIG. 4B depicts the situation which an illustrative transistor 430B is comprised of sidewall spacers 40B that have a thickness S1 that is greater than the thickness "S" of the sidewall spacers 40 depicted in FIG. 4A. One problem associated with having sidewall spacers 40B with a width greater than anticipated by the design process, is that regions 47 of the source/drain regions 45, i.e., the portions of the substrate that are subjected to the second higher-concentration implant step, are moved further away from the gate conductor 38B than ) they are in the case of the transistor 430 shown in FIG. 4A, in which the transistor 430 and all of its components are made to their design size. The net result of the over-wide spacers 40B depicted in FIG. 4B is that the dopant atoms are spaced further apart than they would otherwise be, thereby, effectively increasing the channel-length of the transistor. By varying one or more parameters of an anneal process, the dopant atoms in the source/drain regions 45 of the transistor 430B in FIG. 4B can be driven so as to cause the distribution of the dopant atoms in the source/drain regions 45 to be more like the dopant distribution that would be achieved after processing is complete on the transistor 430 shown in FIG. 4A. This region is depicted by the dashed-line 41 in FIG. 4B.

Figure 5A:
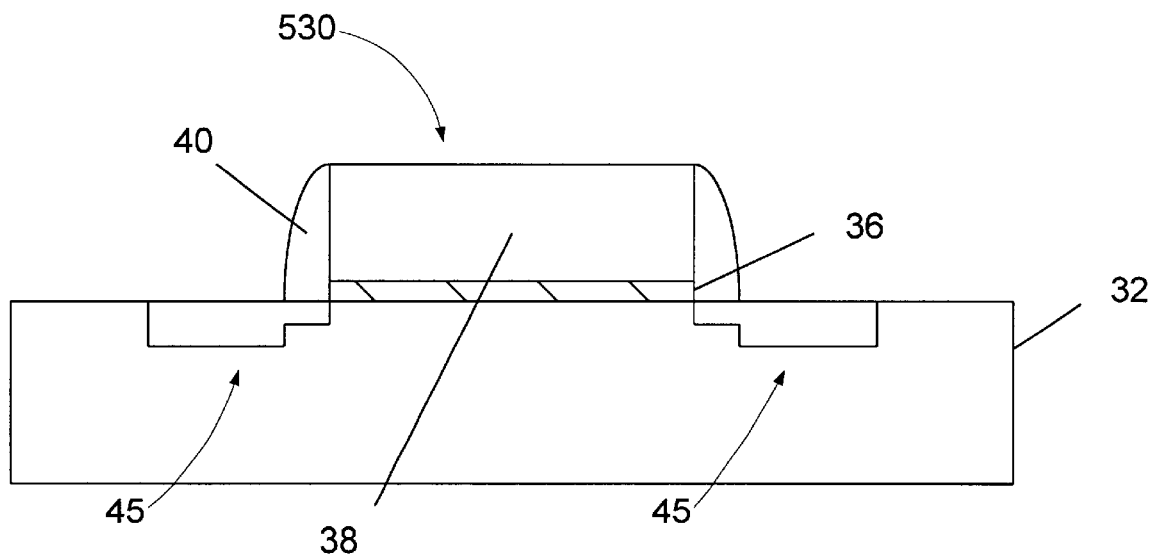
FIGS. 5A–5B are cross-sectional views of a partially formed transistor depicting yet another illustrative situation where the present invention may be employed.
Figure 5B:
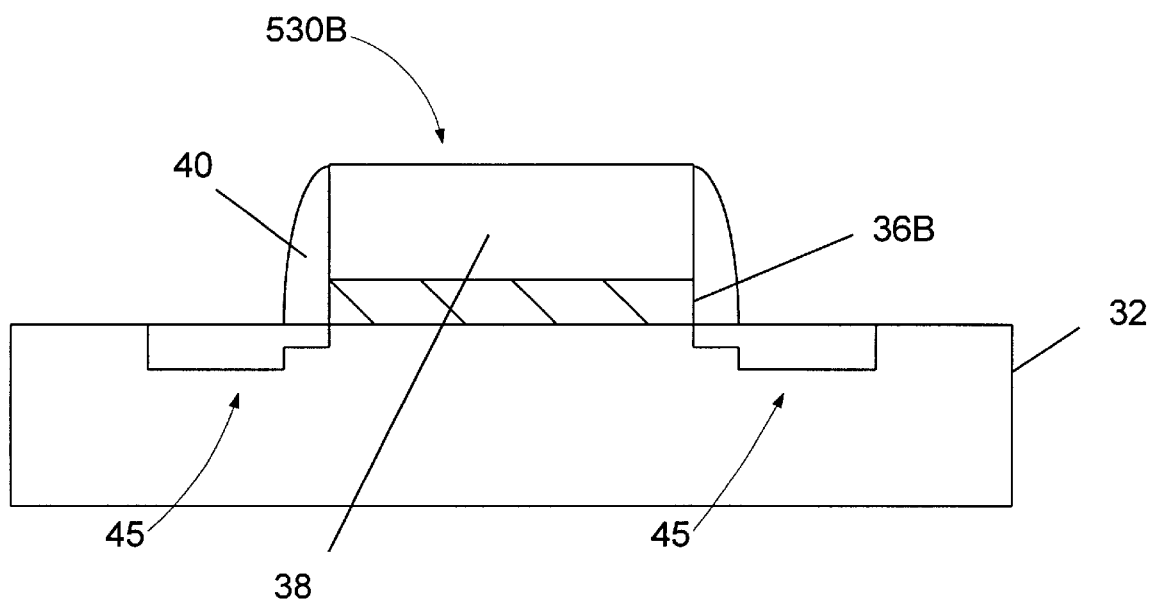

FIGS. 5A and 5B depict yet another illustrative situation in which the present invention may be employed. A transistor 530 depicted in FIG. 5A is one in which the various components of the transistor 530, including a gate dielectric 36B, are formed to their design sizes. In contrast, the gate dielectric 36B shown on transistor 530B in Figure SB is formed to a greater thickness than that anticipated by the design process, i.e., the gate dielectric 36B shown in FIG. 530B is thicker than the gate dielectric 36 shown in FIG. 5A. Because the drive current of a transistor is inversely proportional to the thickness of the gate dielectric, the drive current of the transistor 530B would be smaller than the drive current of the transistor 530 shown in FIG. 5A. By varying one or more parameters of the anneal process, the dopant atoms in the source/drain regions 45 in FIG. 5B can be driven closer together to, in effect, reduce the channel-length of the transistor shown in FIG. 5B.

Figure 6:
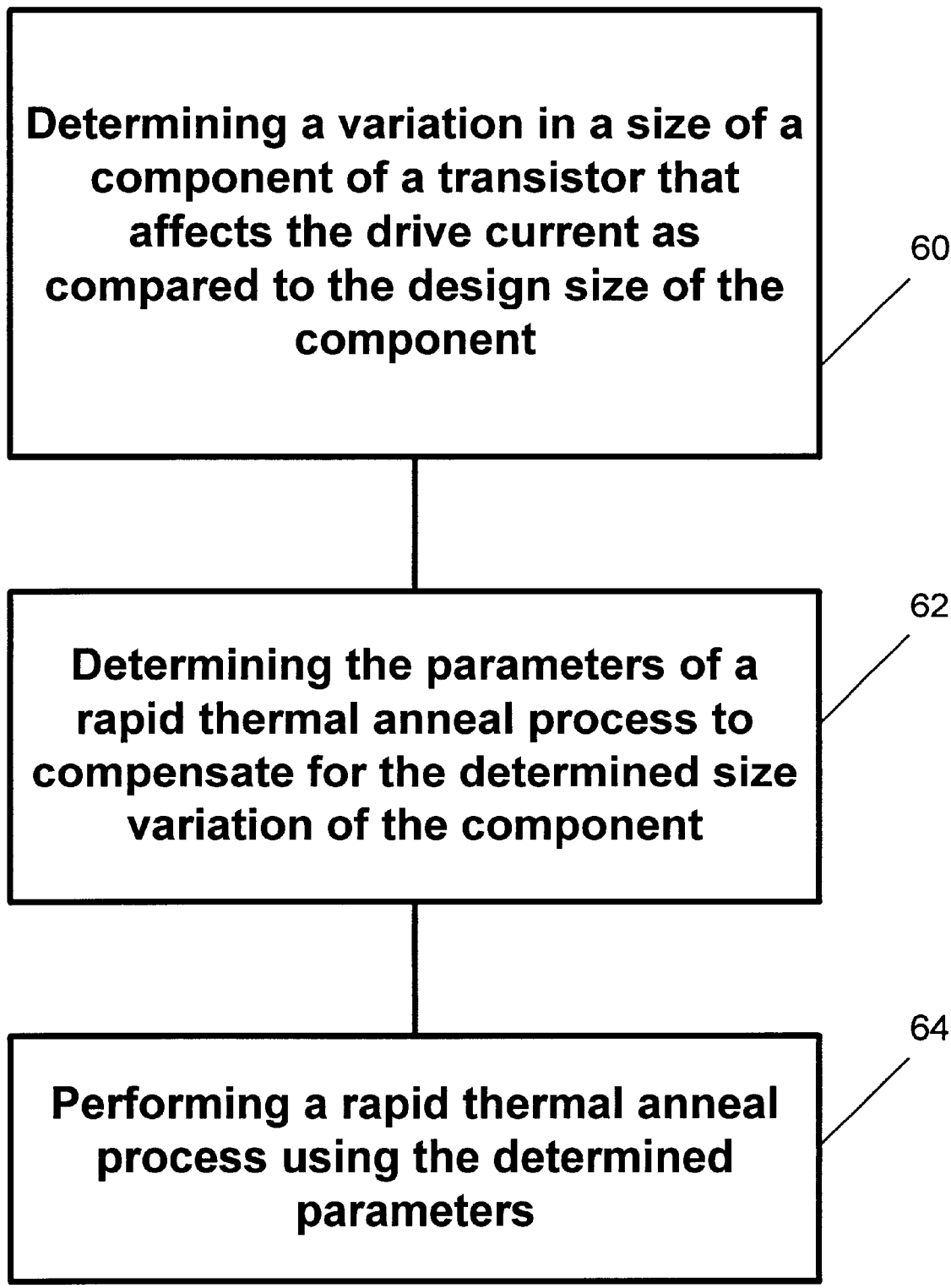
FIG. 6 is a flowchart depicting one illustrative embodiment of the present invention.

One illustrative embodiment of the present invention is depicted in flowchart form in FIG. 6. As shown therein, the present invention comprises determining a variation in a size of a component of a transistor that affects the drive current of a transistor as compared to the design size of the component, as indicated in block 60, determining the parameters of a rapid thermal anneal process to compensate for the determined size variation of the component, as indicated at block 62, and performing a rapid thermal anneal process using the determined parameters as, indicated in block 64. The step performed at block 60 applies to any component of a transistor that will affect the drive current of the transistor, e.g., the width of a gate conductor, the thickness of a dielectric layer, the width of sidewall spacers, etc. This step may be performed by direct measurement using an appropriate metrology tool, e.g. an ellipsometer for measuring a thickness of a dielectric layer, or an in-line scanning electron microscope for measuring the width of a gate conductor, etc. Moreover, this determination maybe made on a relative basis, i.e., the amount of variation of the component as compared to its design size, or it may simply be a measurement of the absolute size of the component, e.g., the total thickness of a dielectric layer.

The step indicated in block 62 involves determining the parameters of an anneal process that may be used to compensate for the determined size variation of the component referenced in block 62. For example, the duration of the anneal process may be varied, the temperature of the anneal process may be varied, or both may be varied. Moreover, this act of determining the parameters of the anneal process may be based upon calculation or upon a table corresponding a given size or variation in size of a component to the appropriate parameters of the anneal process. Next, the process involves performing an anneal process, e.g., a rapid thermal anneal process, using the parameters determined at block 62. Of course, the present invention may be performed with any rapid thermal anneal tool, or an equivalent type tool.

Figure 7:
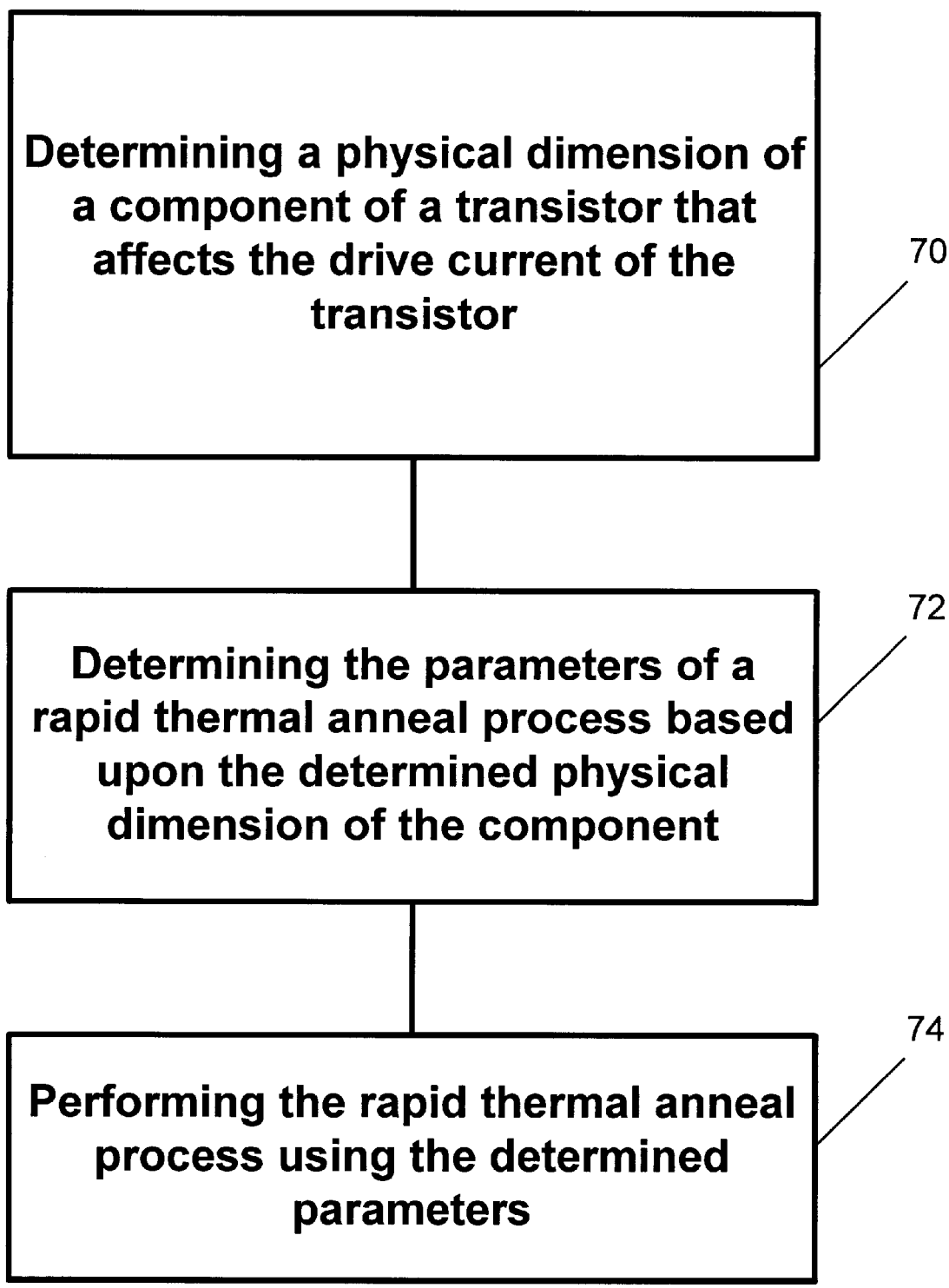
FIG. 7 is another flowchart depicting yet another illustrative embodiment of the present invention.

FIG. 7 is another illustrative example of the present invention depicted in flowchart form. As shown in block 70, the invention comprises determining a physical dimension of a component of a transistor that affects the drive current of the transistor, determining the parameter of a rapid anneal process based upon the determined physical dimension of the component, as indicated in block 72, and performing a rapid thermal anneal process using the determined parameters, as indicated in block 74. The step performed at block 70 may be performed by any metrology tool capable of determining a physical dimension of such a component e.g., an in-line SEM for determining a gate width, an ellipsometer for measuring a thickness of a dielectric layers etc. As stated previously, the process of determining the parameters of the rapid thermal anneal process, as indicated at block 72, may be performed by calculation or based upon some correspondence between the process parameters of the anneal process and the physical dimension of the component, as determined at block 70.

The degree to which a parameter of an anneal process may be varied to compensate for component sizes that are different than the design size of the component are matters of design choice that may depend upon the particular device under construction and the technology involved. For example, if it is determined that it is necessary to drive the dopant atoms closer together, an illustrative anneal temperature may be increased from 1000° C. to 1005° C., while keeping the duration of the anneal process the same. For an illustrative NMOS technology transistor, increasing the temperature of the anneal process by approximately 5° C. results in changing the channel-length approximate 1 nm, as compared to the channel-length if the anneal were performed at 1000° C. For PMOS technology, the ratio of anneal temperature or duration to the distance the dopant atoms are moved would very likely be different. Thus, through this technique, the drive current of a transistor may be maintained within acceptable limits even though the various components of the transistor may be manufactured to a variety of different sizes.

Moreover, the present invention may be employed in situation where the various components are made smaller than the sizes anticipated by the design process. The anneal process referenced herein, may be performed at any time after the dopant atoms are implanted to the desired junction depth, and it may be split two or more such processes. In one illustrative example, the parameters of the anneal process that are used to activate the dopant and repair any damage to the lattice structure of the source/drain regions may be varied to achieve the purposes of the present invention. Of course, the anneal process may be an entirely separate process.

The present invention may also be embodied in a machine or computer readable format, e.g., an appropriately programmed computer, a software program written in any of a variety of programming languages. The software program would be written to carry out various functional operations of the present invention, such as those indicated in FIGS. 6 and 7, and elsewhere in the specification. Moreover, a machine or computer readable format of the present invention may be embodied in a variety of program storage devices, such as a diskette, a hard disk, a CD, a DVD, a nonvolatile electronic memory, or the like. The soft-ware program may be run on a variety of devices, e.g., a processor.

Figure 8:
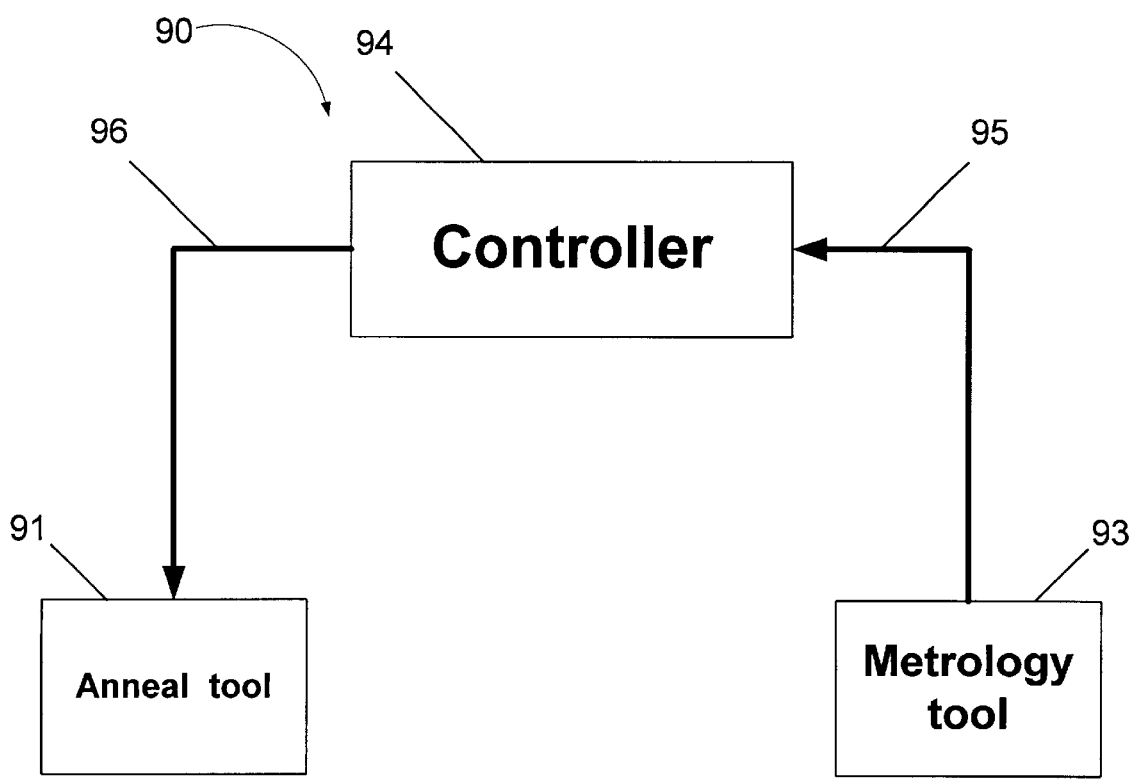
FIG. 8 is a block diagram depicting one illustrative embodiment of a system that may use the present invention.

The present invention is also directed to a processing system, e.g., a processing tool or combination of processing tools, for accomplishing the present invention. As shown in FIG. 8, an illustrative system 90 is comprised of an anneal tool 91, a metrology tool 93, and a controller 94. In one illustrative process flow, variations in the size of a component of a transistor are determined using the metrology tool 93. The results obtained by the metrology tool 93 are sent to the controller 94 via input line 95. In turn, the controller 94 may send commands to the anneal tool 91 to adjust or vary one or more parameter of an anneal process, or use a particular anneal process, based upon the determined size variation of the component of the transistor.

The anneal tool 90 may be any tool used in semiconductor fabrication operations to heat process layers or wafers. In one illustrative embodiment, the anneal tool 90 is a rapid thermal anneal tool. The metrology tool 93 may be any tool that is useful for determining the measurement under consideration, e.g., an on-line SEM for measuring a gate width. Moreover, the anneal tool 91 and metrology tool 93 may be stand-alone units, or they may be combined with one another in a processing tool. The controller 94 may be any type of device that includes logic circuitry for executing instructions. Moreover, the controller 94 depicted in FIG. 8 may be a stand-alone controller or it may be one or more of the controllers already resident on either or both of the anneal tool 91, the metrology tool 93, or another process tool, e.g., an etcher that is used to perform the etch process that defines the gate width.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   determining a size variation of a component of a transistor as compared to a design size of said component;
   determining at least one parameter of an anneal process to be performed on said transistor based upon said determined size variation; and
   performing said anneal process using said determined at least one parameter of said anneal process.

2. The method of claim 1, wherein determining a size variation of a component of a transistor as compared to a design size of said component comprises determining a size variation of a gate conductor of a transistor as compared to a design size of said gate conductor.

3. The method of claim 1, wherein determining a size variation of a component of a transistor as compared to a design size of said component comprises determining a size variation of a sidewall spacer of a transistor as compared to a design size of said sidewall spacer.

4. The method of claim 1, wherein determining a size variation of a component of a transistor as compared to a design size of said component comprises determining a thickness variation of a gate dielectric of a transistor as compared to a design thickness of said gate dielectric.

5. The method of claim 1, wherein determining at least one parameter of an anneal process to be performed on said transistor based upon said determined size variation comprises determining at least one of a duration and a temperature of an anneal process to be performed on said transistor based upon said determined size variation.

6. The method of claim 1, wherein determining at least one parameter of an anneal process to be performed on said transistor based upon said determined size variation comprises determining at least one parameter of a rapid thermal anneal process to be performed on said transistor based upon said determined size variation.

7. The method of claim 1, wherein determining a size variation of a component of a transistor as compared to a design size of said component comprises determining a differential size of said component as compared to a design size of said component.

8. The method of claim 1, wherein determining a size variation of a component of a transistor as compared to a design size of said component comprises determining an absolute size of said component as compared to a design absolute size of said component.

9. A method, comprising:
   determining a size variation of at least one of a gate conductor, a sidewall spacer and a gate dielectric of a transistor as compared to a design size of said at least one of a gate conductor, a sidewall spacer and a gate dielectric; determining at least one parameter of a rapid thermal anneal process to be performed on said transistor based upon said determined size variation; and
   performing said rapid thermal anneal process using said determined at least one parameter of said anneal process.

10. The method of claim 9, wherein determining at least one parameter of a rapid thermal anneal process to be performed on said transistor based upon said determined size variation comprises determining at least one of a duration and a temperature of a rapid thermal anneal process to be performed on said transistor based upon said determined size variation.

11. The method of claim 9, wherein determining a size variation of at least one of a gate conductor, a sidewall spacer, and a gate dielectric of a transistor as compared to a design size of said at least one of a gate conductor, a sidewall spacer, and a gate dielectric comprises determining a differential size of said at least one of a gate conductor, a sidewall spacer, and a gate dielectric as compared to a design size of said at least one of a gate conductor, a sidewall spacer, and a gate dielectric.

12. The method of claim 9, wherein determining a size variation of at least one of a gate conductor, a sidewall spacer, and a gate dielectric of a transistor as compared to a design size of said at least one of a gate conductor, a sidewall spacer, and a gate dielectric comprises determining an absolute size of said at least one of a gate conductor, a sidewall spacer, and a gate dielectric as compared to a design absolute size of said at least one of a gate conductor, a sidewall spacer, and a gate dielectric.

13. A method, comprising:
   determining a physical dimension of at least one of a gate conductor, a sidewall spacer, and a gate dielectric of a transistor;

determining at least one parameter of an anneal process to be performed on said transistor based upon said determined physical dimension; and performing said anneal process using said determined at least one parameter of said anneal process.

14. The method of claim 13, wherein determining a physical dimension of at least one of a gate conductor, a sidewall spacer, and a gate dielectric of a transistor comprises determining a width of a gate conductor of a transistor.

15. The method of claim 13, wherein determining a physical dimension of at least one of a gate conductor, a sidewall spacer, and a gate dielectric of a transistor comprises determining a width of a sidewall spacer of a transistor.

16. The method of claim 13, wherein determining a physical dimension of at least one of a gate conductor, a sidewall spacer, and a gate dielectric of a transistor comprises determining a thickness of a gate dielectric of a transistor.

17. The method of claim 13, wherein determining at least one parameter of an anneal process to be performed on said transistor based upon said determined physical dimension comprises determining at least one of a duration and a temperature of an anneal process to be performed on said transistor based upon said determined physical dimension.

18. The method of claim 13, wherein determining at least one parameter of an anneal process to be performed on said transistor based upon said determined physical dimension comprises determining at least one parameter of a rapid thermal anneal process to be performed on said transistor based upon said determined physical dimension.

19. The method of claim 13, wherein determining a physical dimension of at least one of a gate conductor, a sidewall spacer, and a gate dielectric of a transistor comprises determining a relative physical dimension of at least one of a gate conductor, a sidewall spacer, and a gate dielectric of a transistor as compared to a design physical dimension of said at least one of a gate conductor, a sidewall spacer, and a gate dielectric of a transistor.

20. The method of claim 13, wherein determining a physical dimension of at least one of a gate conductor, a sidewall spacer, and a gate dielectric of a transistor comprises determining an absolute physical dimension of at least one of a gate conductor, a sidewall spacer, and a gate dielectric of a transistor as compared to a design absolute physical dimension of said at least one of a gate conductor, a sidewall spacer, and a gate dielectric of a transistor.

21. A method, comprising:
determining a width of a gate conductor of a transistor;
determining at least one parameter of a rapid thermal anneal process to be performed on said transistor based upon said determined width of said gate conductor; and
performing said rapid thermal anneal process using said determined at least one parameter of said anneal process.

22. A method, comprising:
determining a width of a sidewall spacer;
determining at least one parameter of a rapid thermal anneal process to be performed on said transistor based upon said determined width of said sidewall spacer; and
performing said anneal process using said determined at least one parameter of said anneal process.

23. A method, comprising:
determining a thickness of a gate dielectric of a transistor;

determining at least one parameter of a rapid thermal anneal process to be performed on said transistor based upon said determined thickness of said gate dielectric; and
performing said anneal process using said determined at least one parameter of said anneal process.

24. A method, comprising:
determining a size variation of a component of a transistor as compared to a design size of said component;
providing said determined size variation to a controller, said controller determining at least one parameter of an anneal process to be performed on a transistor based upon said determined size variation; and
performing said anneal process using said determined at least one parameter of said anneal process.

25. The method of claim 24, wherein determining a size variation of a component of a transistor as compared to a design size of said component comprises determining a size variation of a gate conductor of a transistor as compared to a design size of said gate conductor.

26. The method of claim 24, wherein determining a size variation of a component of a transistor as compared to a design size of said component comprises determining a size variation of a sidewall spacer of a transistor as compared to a design size of said sidewall spacer.

27. The method of claim 24, wherein determining a size variation of a component of a transistor as compared to a design size of said component comprises determining a thickness variation of a gate dielectric of a transistor as compared to a design thickness of said gate dielectric.

28. The method of claim 24, wherein determining at least one parameter of an anneal process to be performed on a transistor based upon said determined size variation comprises determining at least one of a duration and a temperature of an anneal process to be performed on a transistor based upon said determined size variation.

29. The method of claim 24, wherein determining at least one parameter of an anneal process to be performed on a transistor based upon said determined size variation comprises determining at least one parameter of a rapid thermal anneal process to be performed on a transistor based upon said determined size variation.

30. The method of claim 24, wherein determining a size variation of a component of a transistor as compared to a design size of said component comprises determining a differential size of said component as compared to a design size of said component.

31. The method of claim 24, wherein determining a size variation of a component of a transistor as compared to a design size of said component comprises determining an absolute size of said component as compared to a design absolute size of said component.

32. A method, comprising:
determining a physical dimension of at least one of a gate conductor, a sidewall spacer, and a gate dielectric of a transistor;
providing said determined physical dimension to a controller, said controller determining at least one parameter of an anneal process to be performed on a transistor based upon said determined physical dimension; and
performing said anneal process using said determined at least one parameter of said anneal process.

33. The method of claim 32, wherein determining a physical dimension of at least one of a gate conductor, a sidewall spacer, and a gate dielectric of a transistor comprises determining a width of a gate conductor of a transistor.

34. The method of claim 32, wherein determining a physical dimension of at least one of a gate conductor, a sidewall spacer, and a gate dielectric of a transistor comprises determining a width of a sidewall spacer of a transistor.

35. The method of claim 32, wherein determining a physical dimension of at least one of a gate conductor, a sidewall spacer, and a gate dielectric of a transistor comprises determining a thickness of a gate dielectric of a transistor.

36. The method of claim 32, wherein determining at least one parameter of an anneal process to be performed on a transistor based upon said determined physical dimension comprises determining at least one of a duration and a temperature of an anneal process to be performed on a transistor based upon said determined physical dimension.

37. The method of claim 32, wherein determining at least one parameter of an anneal process to be performed on a transistor based upon said determined physical dimension comprises determining at least one parameter of a rapid thermal anneal process to be performed on a transistor based upon said determined physical dimension.

38. The method of claim 32, wherein determining a physical dimension of at least one of a gate conductor, a sidewall spacer, and a gate dielectric of a transistor comprises determining a relative physical dimension of at least one of a gate conductor, a sidewall spacer, and a gate dielectric of a transistor as compared to a design physical dimension of said at least one of a gate conductor, a sidewall spacer, and a gate dielectric of a transistor.

39. The method of claim 32, wherein determining a physical dimension of at least one of a gate conductor, a sidewall spacer, and a gate dielectric of a transistor comprises determining an absolute physical dimension of at least one of a gate conductor, a sidewall spacer, and a gate dielectric of a transistor as compared to a design absolute physical dimension of said at least one of a gate conductor, a sidewall spacer, and a gate dielectric of a transistor.

* * * * *